(12) United States Patent
Kim

(10) Patent No.: US 7,615,838 B2
(45) Date of Patent: Nov. 10, 2009

(54) CMOS IMAGE SENSOR AND METHOD FOR MANUFACTURING THE SAME

(75) Inventor: Jong Min Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/851,223

(22) Filed: Sep. 6, 2007

(65) Prior Publication Data
US 2008/0087924 A1    Apr. 17, 2008

(30) Foreign Application Priority Data
Oct. 17, 2006    (KR) ........................ 10-2006-0100781

(51) Int. Cl.
*H01L 31/113* (2006.01)
(52) U.S. Cl. ............... 257/462; 257/292; 257/E31.053; 257/E31.083; 257/E31.085
(58) Field of Classification Search ................. 257/462, 257/292, E31.053, E31.083, E31.085
See application file for complete search history.

(56) References Cited
U.S. PATENT DOCUMENTS

| | | | |
|---|---|---|---|
| 6,744,444 B2 * | 6/2004 | Minami et al. ............... 345/699 |
| 7,256,469 B2 * | 8/2007 | Kanbe ........................ 257/461 |
| 2005/0139943 A1 * | 6/2005 | Kanbe ........................ 257/431 |
| 2005/0194655 A1 * | 9/2005 | Sakano et al. ................ 257/462 |
| 2006/0076588 A1 * | 4/2006 | Nozaki ........................ 257/292 |
| 2007/0069260 A1 * | 3/2007 | Stevens ........................ 257/292 |

FOREIGN PATENT DOCUMENTS

JP    2000-31451    1/2000

* cited by examiner

*Primary Examiner*—Victor A Mandala
(74) *Attorney, Agent, or Firm*—Workman Nydegger

(57) ABSTRACT

A CMOS image sensor and a method for manufacturing the same. In one example embodiment, a CMOS image sensor includes a field region and an active region, a second conductive bottom region, a first conductive well region, a second conductive top region, and a first conductive high concentration region. The field region and the active region are formed in a first conductive semiconductor substrate. The second conductive bottom region has a first depth in part of the active region. The first conductive well region is formed in the active region. The second conductive top region has a depth that is less than the first depth. The first conductive high concentration region has a depth that is less than the depth of the second conductive top region.

11 Claims, 5 Drawing Sheets

CMOS IMAGE SENSOR AND METHOD FOR MANUFACTURING THE SAME

CROSS-REFERENCE TO RELATED APPLICATION

This application claims priority to Korean Application No. 10-2006-0100781, filed on Oct. 17, 2006, which is incorporated herein by reference in its entirety.

BACKGROUND

1. Field of the Invention

The present invention relates to a Complementary Metal Oxide Semiconductor (CMOS) image sensor and a method for manufacturing the same.

2. Description of the Related Art

In general, a Complementary Metal Oxide Semiconductor (CMOS) image sensor includes a photodiode and a CMOS device. The photodiode is a light receiving element. The CMOS device provides an electric signal using electric charge accumulated in the photodiode.

FIG. 1 discloses a prior art CMOS image sensor. The CMOS image sensor of FIG. 1 includes a P-type semiconductor substrate 1101, a field oxide film 1102, an N-type doping region 1103, a P-type high concentration doping region 1104, a first P-type well region 1105, and a second P-type well region 1106. The field oxide film 1102 is formed in a predetermined region of the P-type semiconductor substrate 1101. The P-type semiconductor substrate 1101 also defines a field region and an active region. The N-type doping region 1103 of photodiode source is formed to have a first depth at a whole surface or part of the active region of the P-type semiconductor substrate 1101. The P-type high concentration doping region 1104 is formed to have a second depth that is less than the first depth at a whole surface of the active region of the P-type semiconductor substrate 1101. The first P-type well region 1105 is formed to isolate the field oxide film 1102 from the N-type doping region 1103 of the photodiode source. The second P-type well region 1106 is formed in a different part of the active region. A drain is formed in the second P-type well region 1106. A gate is formed over the semiconductor substrate 1101 with a gate insulating film being interposed therebetween.

FIG. 2 discloses mask patterns for forming the prior art CMOS image sensor of FIG. 1. FIG. 2 includes a mask pattern 1201, an active region mask pattern 1202, and a mask pattern 1203. When forming the prior art CMOS image sensor of FIG. 1, the mask pattern 1201 can be used to form the N-type doping region 1103, the active region mask pattern 1202 can be used to define the field region and the active region, and the mask pattern 1203 can be used to form the first P-type well region 1105. The first P-type well region 1105 is formed to isolate the field oxide film 1102 from the N-type doping region 1103 of the photodiode source and from the second P-type well region 1106.

FIG. 3 discloses a doping concentration of impurity ions in a depth direction of the prior art CMOS image sensor of FIG. 1. The log scale of FIG. 3 discloses the doping concentration of impurity ions in a vertical direction of a center of the N-type doping region 1103 of the prior art CMOS image sensor of FIG. 1. FIG. 3 discloses that the N-type doping region 1103 is constructed to have a doping concentration lower than that of the P-type semiconductor substrate 1101.

FIG. 3 also discloses a depletion region between two dotted lines. If electrons and holes generated by incident light are generated in the depletion region, the electrons and holes are not recombined and are isolated in respective different directions by an electric field formed within the depletion region. In this case, the electrons can be accumulated in the N-type doping region 1103. Therefore, the depletion region should have a large volume in the active region to effectively capture incident light at a low illuminance. However, if the depletion region increases as disclosed in FIG. 3, this results in a corresponding reduction in capacitance. Thus, the maximum amount of charge capable of being captured under any condition of variation amount of voltage given for the N-type doping region 1103 decreases.

FIG. 4 discloses a dynamic range of the prior art CMOS image sensor of FIG. 1.

$$dQ=Cpd*dV \qquad \text{[Equation 1]}$$

where dQ: variation of amount of charges depending on variation of voltage,

Cpd: capacitance of N-type doping region 1103, and dV: variation of voltage of N-type doping region 1103.

As disclosed in Equation 1, when a voltage (Vpd=Vp) applied to the N-type doing region 1103 is equal to zero after light is incident and electrons are accumulated, a maximum capacity of the N-type doping region 1103 for accumulating electrons generated by light is equal to Cpd*Vp. This characteristic is expressed using a dynamic range as shown in FIG. 4.

One difficulty associated with the photodiode structure of the prior art CMOS image sensor of FIG. 1 is the trade off between sensitivity and dynamic range. In particular, an expansion in a vertical direction of the depletion region in the prior art CMOS image sensor of FIG. 1 leads to an improvement of sensitivity at a low illuminance with the improvement of photoelectric conversion efficiency. However, the expansion of the depletion region results in a reduction of a capacitance of the photodiode. Thus, a reduction of a capacity of a pixel device results in a deterioration of a dynamic range.

SUMMARY OF EXAMPLE EMBODIMENTS

In general, example embodiments of the invention relate to a Complementary Metal Oxide Semiconductor (CMOS) image sensor and a method for manufacturing the same. Example embodiments can improve sensitivity at a low illuminance with the improvement of photoelectric conversion efficiency and at the same time, increase a charge capacity of a photodiode, thereby improving a dynamic range of a pixel device.

In one example embodiment, a CMOS image sensor includes a field region and an active region, a second conductive bottom region, a first conductive well region, a second conductive top region, and a first conductive high concentration region. The field region and the active region are both formed in a first conductive semiconductor substrate. The second conductive bottom region has a first depth in part of the active region. The first conductive well region is formed in the active region and surrounds the second conductive bottom region. The second conductive top region has a depth that is less than the first depth in the active region. The first conductive high concentration region has a depth that is less than the second conductive top region at a whole surface of the semiconductor substrate comprising the second conductive top region.

In another example embodiment, a method for manufacturing a CMOS image sensor includes first forming both a field region and an active region in a first conductive semiconductor substrate. Next, the example method includes forming a second conductive bottom region having a first depth in part of the active region. Then, the example method includes forming a first conductive well region to surround the second conductive bottom region in the active region. Next, the example method includes forming a second conductive top region having a depth that is less than the first depth in the active region. Then, the example method includes implanting first conductive high concentration impurity ions into a whole surface of the semiconductor substrate including the second conductive top region. Finally, the example method includes forming a first conductive high concentration region having a depth that is less than the depth of the second conductive top region.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF EXAMPLE EMBODIMENTS

Hereinafter, example embodiments of the invention will be described in detail with reference to the accompanying drawings.

Figure 5:
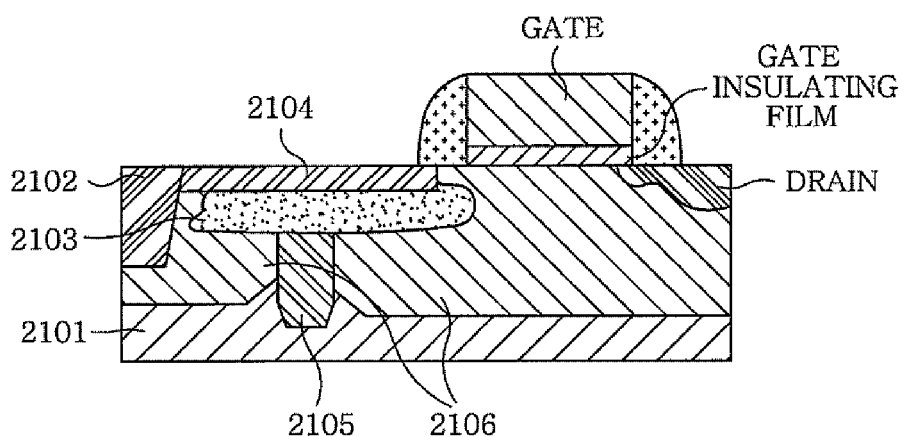
FIG. 5 is a cross-sectional diagram disclosing an example CMOS image sensor.

An example Complementary Metal Oxide Semiconductor (CMOS) image sensor is disclosed in FIG. 5. The example CMOS image sensor includes a first conductive semiconductor substrate 2101, a field oxide film 2102, a second conductive top region 2103, a first conductive high concentration region 2104, a second conductive bottom region 2105, and a first conductive well region 2106. A field region and an active region can be formed in the first conductive semiconductor substrate 2101. The first and second conductive types can be P type and N type, respectively, but other configurations are also contemplated.

As disclosed in FIG. 5, an example photodiode of the example CMOS image sensor includes the second conductive bottom region 2105 that extends in a vertical direction. The second conductive bottom region 2105 can be formed to have a first depth in part of the active region. The second conductive bottom region 2105 can be formed by implanting second conductive impurity ions of a concentration higher than a concentration of impurities of the first conductive semiconductor substrate 2101 and lower than that of the first conductive well region 2106, as discussed in greater detail below.

With continuing reference to FIG. 5, the first conductive well region 2106 can be formed in the active region to surround the second conductive bottom region 2105. The second conductive top region 2103 can be formed to have a depth that is less than the first depth in the active region. The second conductive top region 2103 can be formed wider than the second conductive bottom region 2105. The second conductive top region 2103 can be formed by implanting second conductive impurity ions of a concentration higher than that of the first conductive well region 2106. The second conductive bottom region 2105 can also be plurally formed narrower than the second conductive top region 2103.

The first conductive high concentration region 2104 can be formed to have a depth that is less than the depth of the second conductive top region 2103 over a whole surface of the semiconductor substrate including the second conductive top region 2103.

Therefore, in the example CMOS image sensor disclosed in FIG. 5, the second conductive top region 2103, which is a relatively shallow region, is implanted with N-type high concentration impurities and is sandwiched between the overlying first conductive high concentration region 2104 and the underlying first conductive high concentration well region 2106, resulting in a high capacitance. Also, the second conductive bottom region 2105, which is an N-type low concentration region, can allow a wide depletion region. Therefore, this structure is efficient in that it is not significantly damaged from incident light 2202, as discussed below in connection with FIG. 6.

Figure 1:
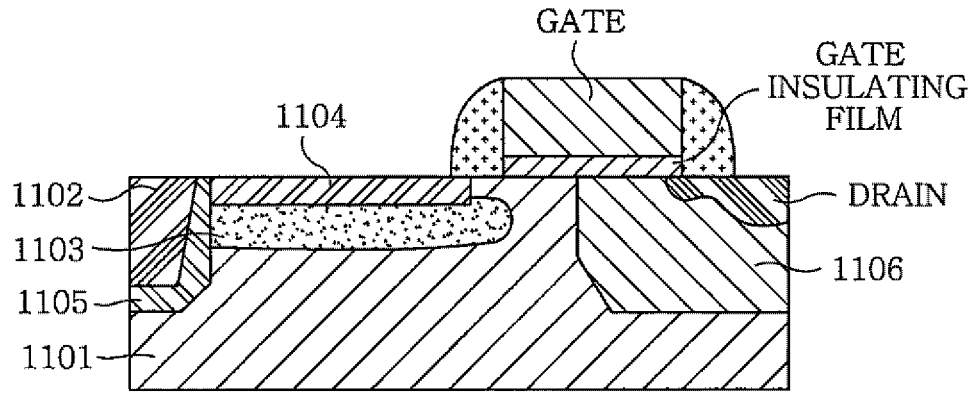
FIG. 1 is a cross-sectional diagram disclosing a prior art Complementary Metal Oxide Semiconductor (CMOS) image sensor.
Figure 2:
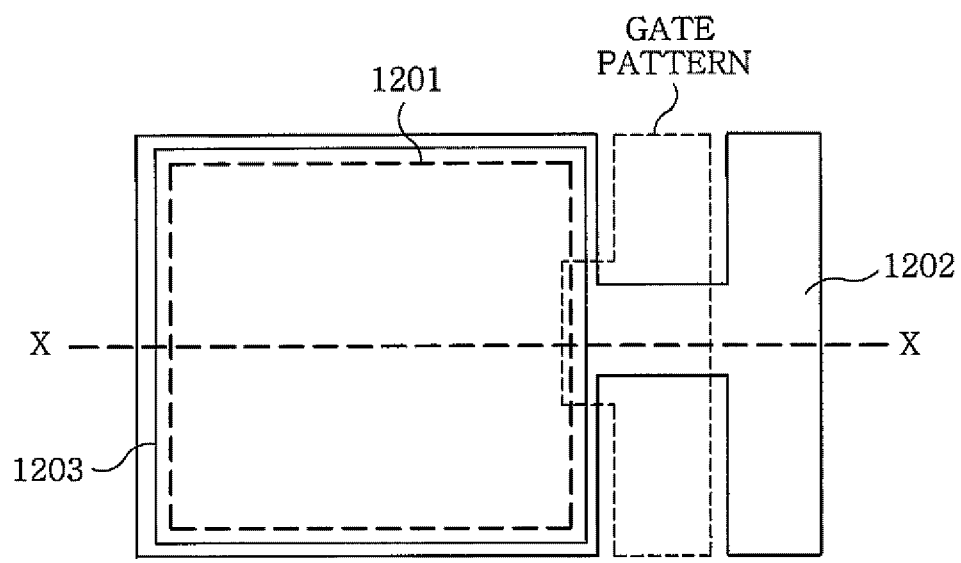
FIG. 2 discloses mask patterns for forming the prior art CMOS image sensor of FIG. 1.
Figure 3:
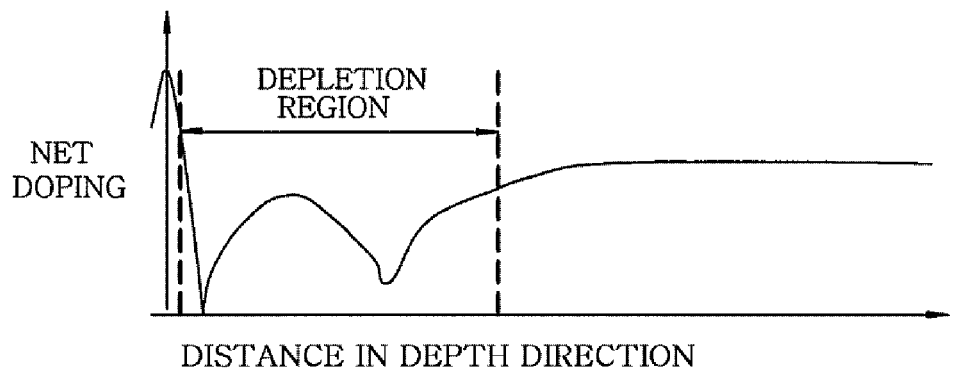
FIG. 3 is a graph disclosing a doping concentration of impurity ions in a depth direction of the prior art CMOS image sensor of FIG. 1.
Figure 4:
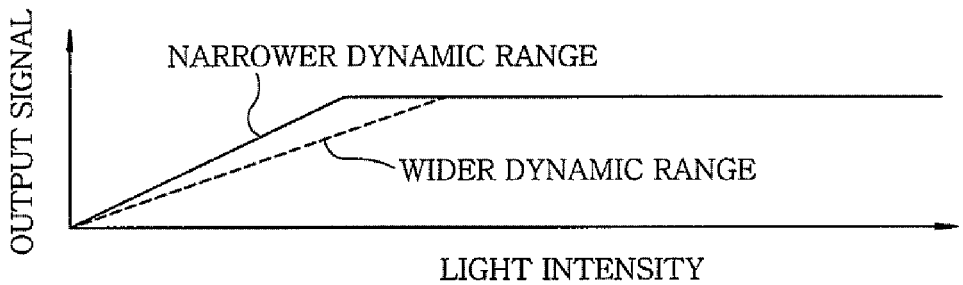
FIG. 4 is a graph disclosing a dynamic range of the prior art CMOS image sensor of FIG. 1.
Figure 6:
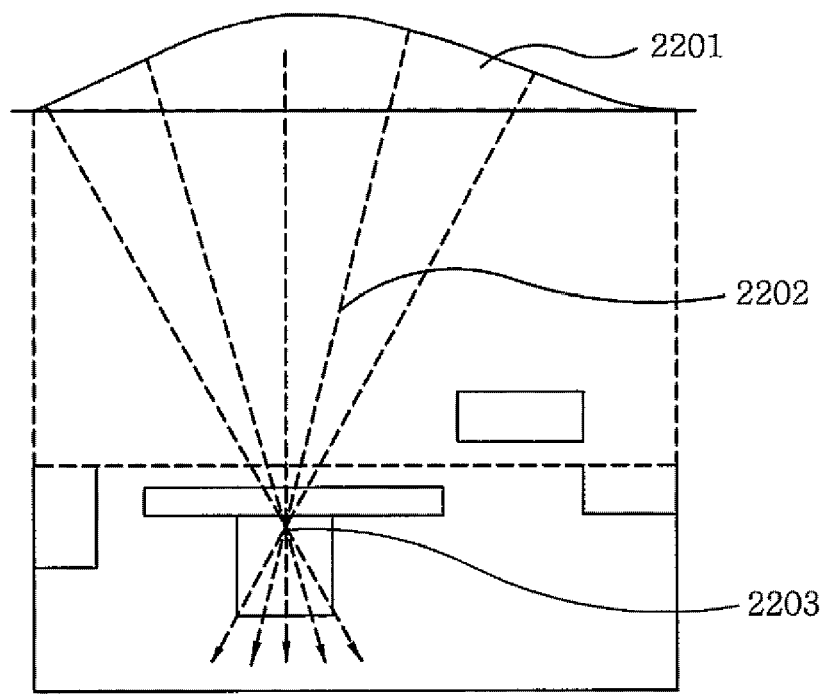
FIG. 6 discloses a light focused on the example CMOS image sensor of FIG. 5.

FIG. 6 discloses light focused on the example CMOS image sensor of FIG. 1. FIG. 6 shows a lens and a track of incident light. As shown in FIG. 6, incident light 2202 is generally incident through a lens 2201 and therefore, the example CMOS image sensor is manufactured to have a focus 2203 at a central portion. The majority of incident light 2202 passes through an N-type low concentration bottom region 2105. Therefore, the example CMOS image sensor has a relatively small loss in focusing electrons generated by available light.

Figure 7:
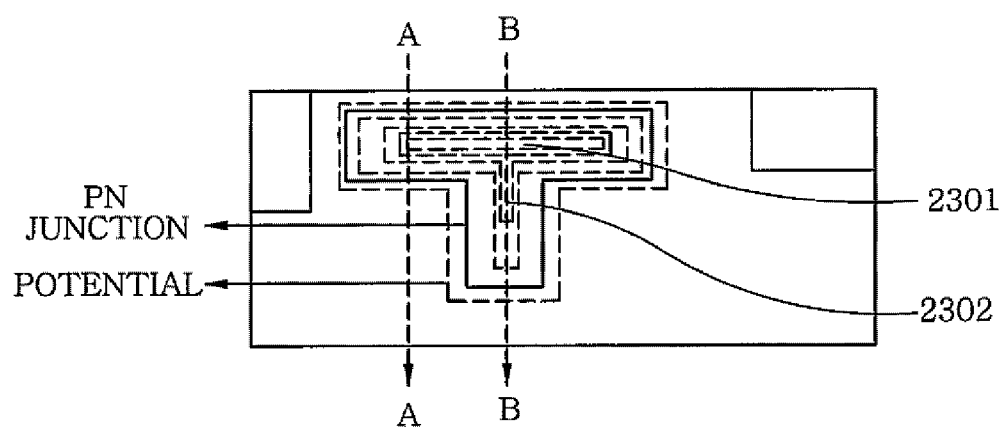
FIG. 7 discloses a contour of a potential well of the example CMOS image sensor of FIG. 5.

FIG. 7 discloses a contour of a potential well of the example CMOS image sensor of FIG. 1. As disclosed in FIG. 7, after a photodiode is reset, a bottom low potential well 2302 has a low pinchoff voltage because of a low doping level. Thus, the bottom low potential well 2302 has a low potential level. A relatively high voltage is applied to a top high potential well 2301. Therefore, charges (electrons) generated from a bottom and captured by an electric field are continuously transferred and accumulated in a top until a voltage of the top reduces by a voltage of the bottom. Therefore, for a time, a bottom depletion region is constantly maintained without change.

Figure 8A:
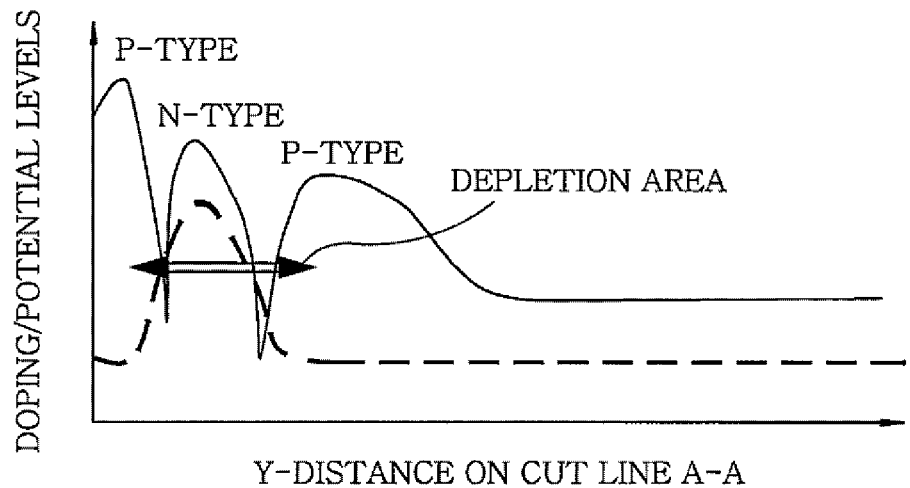
FIGS. 8A and 8B disclose an example doping profile and an example potential profile at sections taken along cut lines A and B. respectively, of FIG. 7.
Figure 8B:
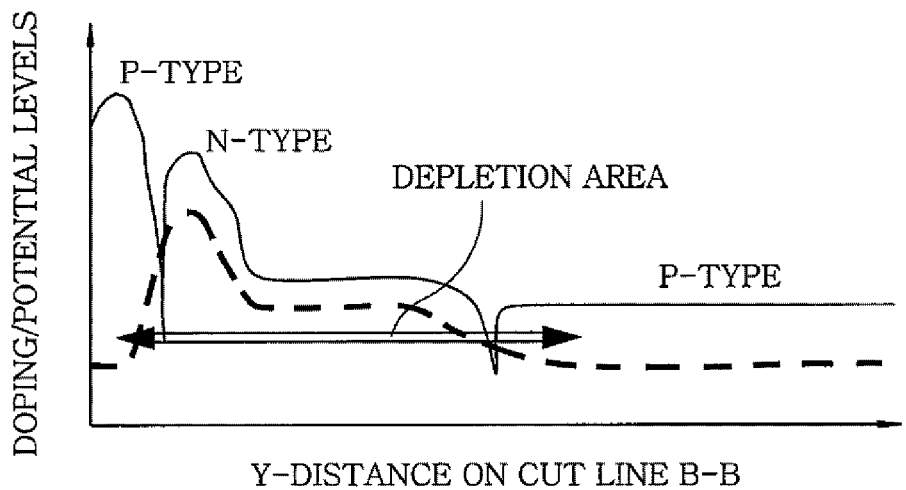

FIGS. 8A and 8B disclose doping and potential profiles in a depth direction (Y-direction) for sections taken along cut lines A and B, respectively, of FIG. 7. Electrons generated by incident light in a depletion area are moved and accumulated in a high potential position.

As disclosed above, an N-type doping region of the example CMOS image sensor can be formed as an N-type high concentration top doping region and an N-type low concentration bottom doping region, thereby increasing sensitivity at a low illuminance and concurrently maximizing a dynamic range of a pixel device.

Figure 9:
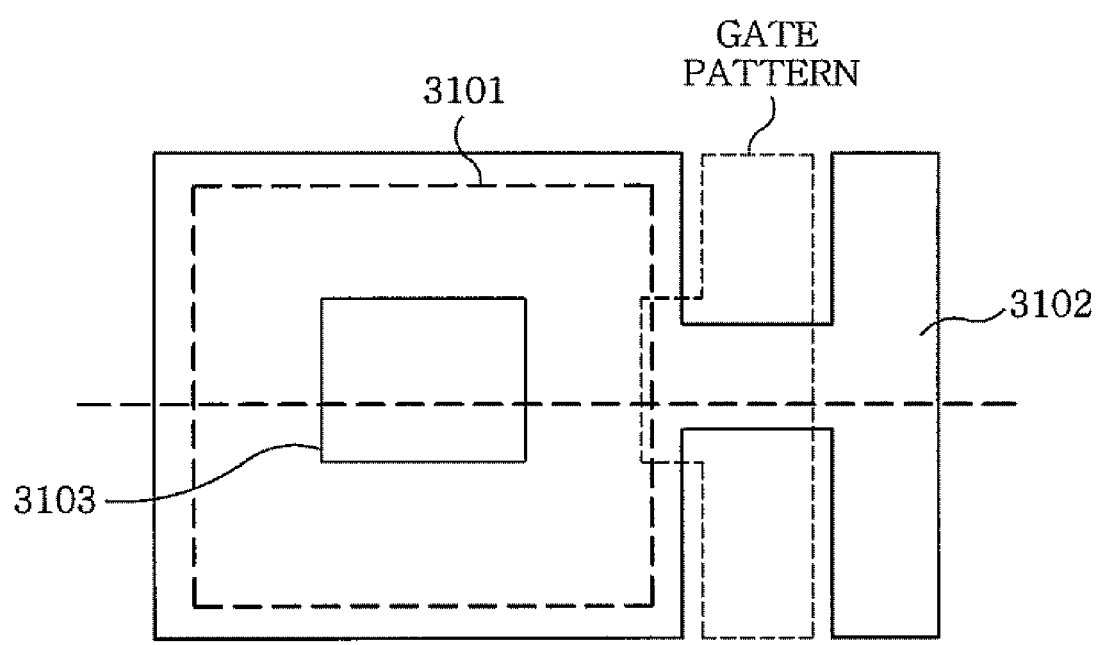
FIG. 9 discloses mask patterns for manufacturing a second example CMOS image sensor.

FIG. 9 discloses mask patterns for manufacturing the example CMOS image sensor of FIG. 5. A method for manufacturing the example CMOS image sensor includes forming a mask used when a P-type well region is formed and implanting with N-type impurities to form an N-type bottom region 2105.

In the method for manufacturing the example CMOS image sensor, a field oxide film 2102 is formed in a predetermined region of a P-type semiconductor substrate 2101 using a LOCal Oxidation of Silicon (LOCOS) or Shallow Trench Isolation (STI) process to define a field region and an active region in the P-type semiconductor substrate 2101. The active region is formed using an active region mask pattern 3102. Next, a P-type well region 2106 of a CMOS is formed in a mask outer region using a P-type well mask pattern 3103.

Part of the P-type semiconductor substrate 2101 of an active region is implanted with N-type impurity ions of a concentration higher than a concentration of impurities of the P-type semiconductor substrate 2101 and lower than that of the P-type well region 2106. Thus, the N-type bottom region 2105 having a first depth is formed.

The mask pattern 3103 for forming the P-type well region 2106 is the same and is opposite in polarity to a mask pattern (not shown) for forming the N-type bottom region 2105. Thus, the P-type well region 2106 is formed to surround the N-type bottom region 2105.

Next, N-type impurity ions of a concentration higher than that of the P-type well region 2106 are implanted, thereby forming an N-type top region 2103 having a depth that is less than the first depth using a photodiode source pattern 3101. Then, P-type high concentration impurity ions are implanted into a whole surface of the active region of the P-type semiconductor substrate 2101 including the N-type bottom region 2105 and the N-type top region 2103. Overlap regions of the P-type well mask pattern 3103 and an N-type photodiode mask are used as regions having a high electrostatic capacity, thereby improving a dynamic range of a pixel device.

As described above in connection with the example CMOS image sensor and example method for manufacturing the same, an N-type doping region can be formed as a N-type high concentration top doping region and an N-type low concentration bottom doping region, thereby increasing sensitivity at a low illuminance and concurrently maximizing a dynamic range of a pixel device.

While example embodiments of the invention have been disclosed and described, it will be understood by those skilled in the art that various changes and modifications may be made without departing from the scope of the invention as defined in the following claims.

What is claimed is:

1. A CMOS image sensor comprising:
    a field region and an active region both formed in a first conductive semiconductor substrate;
    a second conductive bottom region having a first depth in part of the active region;
    a first conductive well region formed in the active region and surrounding the second conductive bottom region;
    a second conductive top region having a depth that is less than the first depth in the active region; and
    a first conductive high concentration region having a depth that is less than the depth of the second conductive top region at a whole surface of the semiconductor substrate comprising the second conductive top region,
    wherein the second conductive bottom region is formed by implanting second conductive impurity ions of a concentration higher than a concentration of impurities of the first conductive semiconductor substrate and lower than that of the first conductive well region.

2. The CMOS image sensor of claim 1, wherein the second conductive top region is formed wider than the second conductive bottom region.

3. The CMOS sensor of claim 1, wherein the second conductive bottom region is plurally formed narrower than the second conductive to region.

4. The CMOS image sensor of claim 1, wherein the second conductive top region is formed by implanting second conductive impurity ions of a concentration higher than that of the first conductive well region.

5. A method for manufacturing a CMOS image sensor, the method comprising:
    forming both a field region and an active region in a first conductive semiconductor substrate;
    forming a second conductive bottom region having a first depth in part of the active region;
    forming a first conductive well region to surround the second conductive bottom region in the active region;
    forming a second conductive top region having a depth that is less than the first depth in the active region;
    implanting first conductive high concentration impurity ions into a whole surface of the semiconductor substrate comprising the second conductive top region; and
    forming a first conductive high concentration region having a depth that is less than the depth of the second conductive top region,
    wherein the second conductive bottom region is formed by implanting second conductive impurity ions of a concentration higher than a concentration of impurities of the first conductive semiconductor substrate and lower than that of the first conductive well region.

6. The method of claim 5, wherein the second conductive top region is formed wider than the second conductive bottom region.

7. The method of claim 5, wherein the second conductive bottom region is formed at an inner and substantially central part of the active region.

8. The method of claim 5, wherein the second conductive top region is formed by implanting second conductive impurity ions of a concentration higher than that of the first conductive well region.

9. The method of claim 5, wherein a mask pattern for forming the first conductive well region is the same as a mask pattern for forming the second conductive bottom region but is opposite to the mask patter in polarity.

10. A CMOS image sensor comprising:
    a field region and an active region both formed in a first conductive semiconductor substrate;
    a second conductive bottom region having a first depth in part of the active region;
    a first conductive well region formed in the active region and surrounding the second conductive bottom region;
    a second conductive top region having a depth that is less than the first depth in the active region; and
    a first conductive high concentration region having a depth that is less than the depth of the second conductive top region at a whole surface of the semiconductor substrate comprising the second conductive top region,
    wherein the first and the second conductive region types are P and N type or N and P type, respectively, and
    wherein the second conductive top region is sandwiched between the first conductive high concentration region and the first conductive well region.

11. A method for manufacturing a CMOS image sensor, the method comprising:
    forming both a field region and an active region in the first conductive semiconductor substrate;

forming a second conductive bottom region having a first depth in part of the active region;

forming a first conductive well region to surround the second conductive bottom region in the active region;

forming a second conductive top region having a depth that is less than the first depth in the active region;

implanting first conductive high concentration impurity ions into a whole surface of the semiconductor substrate comprising the second conductive top region; and forming a first conductive high concentration region having a depth that is less than the depth of the second conductive top region, wherein the first and the second conductive region types are P and N type or N and P type, respectively, and wherein the second conductive top region is sandwiched between the first conductive high concentration region and the first conductive well region.

\* \* \* \* \*